(12) United States Patent
Tamaki et al.

(10) Patent No.: US 8,866,704 B2
(45) Date of Patent: Oct. 21, 2014

(54) LIGHT-EMITTING APPARATUS

(75) Inventors: Junya Tamaki, Chiba (JP); Takuro Yamazaki, Chiba (JP); Yojiro Matsuda, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 770 days.

(21) Appl. No.: 12/970,601

(22) Filed: Dec. 16, 2010

(65) Prior Publication Data

US 2011/0148831 A1    Jun. 23, 2011

(30) Foreign Application Priority Data

Dec. 21, 2009   (JP) ................................. 2009-288831
Nov. 5, 2010    (JP) ................................. 2010-248980

(51) Int. Cl.
  *G09G 3/30*   (2006.01)
  *H01L 51/52*  (2006.01)
  *H01L 27/32*  (2006.01)

(52) U.S. Cl.
  CPC ........ *H01L 51/5253* (2013.01); *H01L 27/3276* (2013.01)
  USPC ............... 345/76; 345/80; 345/211; 345/214; 345/204; 313/504; 313/506

(58) Field of Classification Search
  USPC .............................. 345/76, 80, 211, 214, 204; 313/504–506
  See application file for complete search history.

(56) References Cited

U.S. PATENT DOCUMENTS

| | | | |
|---|---|---|---|
| 2005/0035710 A1 | 2/2005 | Tanase et al. | |
| 2005/0045900 A1* | 3/2005 | Silvernail | ........................ 257/99 |
| 2006/0113907 A1 | 6/2006 | Im | |
| 2007/0126353 A1* | 6/2007 | Kubota et al. | ................. 313/506 |
| 2008/0211396 A1* | 9/2008 | Kimura | ........................ 313/504 |

FOREIGN PATENT DOCUMENTS

| | | |
|---|---|---|
| JP | 2005-63928 A | 3/2005 |
| JP | 2006-156390 A | 6/2006 |
| JP | 2006-228570 A | 8/2006 |

* cited by examiner

*Primary Examiner* — Lun Yi Lao
*Assistant Examiner* — Shaheda Abdin
(74) *Attorney, Agent, or Firm* — Canon, U.S.A., Inc. IP Division

(57) ABSTRACT

In a light-emitting apparatus including a cap layer disposed on a second electrode and a contact portion, which is disposed in an external region outside the light-emitting region and which electrically connects the second electrode to the drive circuit, the formation end of the cap layer is located in the side nearer to the light-emitting region than is the formation end of the second electrode.

12 Claims, 4 Drawing Sheets

LIGHT-EMITTING APPARATUS

BACKGROUND OF THE INVENTION

1. Field of the Invention

The present invention relates to a method for manufacturing a light-emitting apparatus, in particular a light-emitting apparatus provided with an organic electroluminescent element.

2. Description of the Related Art

In recent years, light-emitting apparatuses or display apparatuses including a plurality of organic electroluminescent elements have been researched and developed actively. An active matrix type light-emitting apparatus provided with thin film transistors to drive organic electroluminescent elements has been researched broadly because high-definition, high-quality display can be realized. In general, in the active matrix type light-emitting apparatus, a planarizing layer formed from a resin is disposed in such a way as to cover a drive circuit of a thin film transistor and the like on a substrate, and a plurality of organic electroluminescent elements, in which a lower electrode, an organic compound layer including a light-emitting layer, and an upper electrode are laminated, are disposed on the planarizing layer. The plurality of organic electroluminescent elements are partitioned by a partition member formed from a resin, and the lower electrodes of the individual organic electroluminescent elements are electrically connected to the drive circuit through contact portions different from each other. Furthermore, the upper electrode is disposed on the organic compound layer while being shared by the plurality of organic electroluminescent elements and is electrically connected to a drive circuit disposed in an external region through a contact portion disposed in the external region outside a light-emitting region in which the plurality of organic electroluminescent elements are arranged. Moreover, a resin layer is disposed on the drive circuit in the external region in such a way that an occurrence of damage during a production step after formation of the planarizing layer is suppressed. In addition, in the contact portion disposed in the external region, the resin layer and the planarizing layer are configured to be mutually separated and the resin layer and the partition member are configured to be mutually separated in an in-plane direction of the substrate.

There is a problem in that the organic electroluminescent element is sensitive to moisture and oxygen. In order to protect the organic electroluminescent element from the moisture and oxygen, a technology has been known in which after the organic electroluminescent element is formed, a protective layer is formed by using a high-energy film formation method, e.g., a sputtering method or a plasma CVD method. However, if the protective layer is formed by such a high-energy film formation method, the organic compound layer of the organic electroluminescent element may be damaged. In opposition to this problem, Japanese Patent Laid-Open No. 2006-228570 discloses a configuration, wherein a first protective layer including an organic compound layer of a copper phthalocyanine derivative, an aluminum quinolinol complex, or the like is formed on an upper electrode and a second protective layer, which is formed by a sputtering method or the like and which primarily contains an inorganic material, is disposed on the first protective layer.

In the case where the configuration of Japanese Patent Laid-Open No. 2006-228570 is adopted in the above-described common active matrix type light-emitting apparatus, the resin layer disposed on the drive circuit in the external region may be configured to come into direct contact with the first protective layer containing an organic compound. That is, the upper electrode is formed to become larger than the contact portion and is formed up to on the resin layer in consideration of the accuracy in formation thereof. Consequently, the resin layer may be configured to come into direct contact with the first protective layer. By the way, the resin absorbs moisture and gases easily, so that moisture and gases tend to remain in the inside thereof. Furthermore, the organic compound also absorbs moisture and gases easily. As a result, a problem occurs in that a path to transfer moisture and gases from the resin layer, which is separated in the contact portion, up to the light-emitting region through the first protective layer containing the organic compound is formed and, thereby, the organic electroluminescent element disposed in the light-emitting region are degraded.

Furthermore, an increase in luminous efficiency is mentioned as another issue of the organic electroluminescent element. Regarding this issue, in Japanese Patent Laid-Open No. 2006-156390, an organic capping layer is formed on an organic electroluminescent element by an evaporation method, and the refractive index or the film thickness thereof is controlled, so as to increase the luminous efficiency of the organic electroluminescent element. However, even the configuration in Japanese Patent Laid-Open No. 2006-156390 is employed, the above-described problem occurs in the case where a resin layer on a drive circuit disposed in an external region is configured to come into direct contact with the organic capping layer.

SUMMARY OF THE INVENTION

The present invention provides a light-emitting apparatus including a cap layer on an organic electroluminescent element, wherein transfer of moisture and gases from a resin layer disposed in an external region to a light-emitting region is suppressed.

A light-emitting apparatus according to the present invention includes a substrate having a light-emitting region, in which a plurality of pixels are arranged, and an external region disposed outside the above-described light-emitting region, a drive circuit disposed on the above-described substrate, a planarizing layer to flatten the upper portion of the above-described drive circuit, a first electrode disposed on the above-described planarizing layer, a partition member to partition the above-described first electrode on a pixel basis, an organic compound layer disposed on the above-described first electrode, a second electrode disposed over the above-described organic compound layer, the above-described partition member, and the above-described light-emitting region, a cap layer disposed on the above-described second electrode, and a resin layer disposed in the above-described external region while being spaced from the above-described planarizing layer and the above-described partition member with a space region therebetween, wherein the formation end of the above-described cap layer is located in the side nearer to the light-emitting region than is the formation end of the above-described second electrode.

In the light-emitting apparatus including the cap layer on the organic electroluminescent element, according to an embodiment of the present invention, transfer of moisture and gases from the resin layer disposed in the external region to the light-emitting region is suppressed.

Further features of the present invention will become apparent from the following description of exemplary embodiments with reference to the attached drawings.

DESCRIPTION OF THE EMBODIMENTS

Figure 1A:
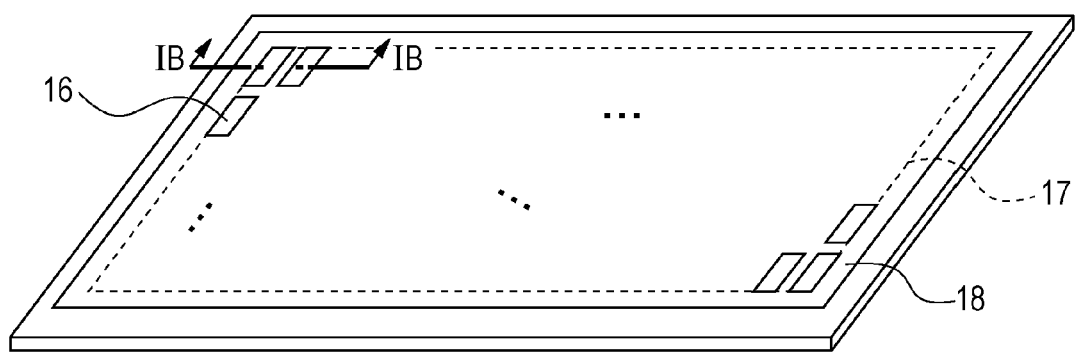
FIGS. 1A to 1C are schematic diagrams of a light-emitting apparatus according to an embodiment of the present invention.

The embodiments according to the present invention will be specifically described below with reference to drawings. In this regard, in the drawings, the individual members are allowed to have sizes sufficient for identifying them and, therefore, the reduced scales are different on a member basis.

Figure 1B:
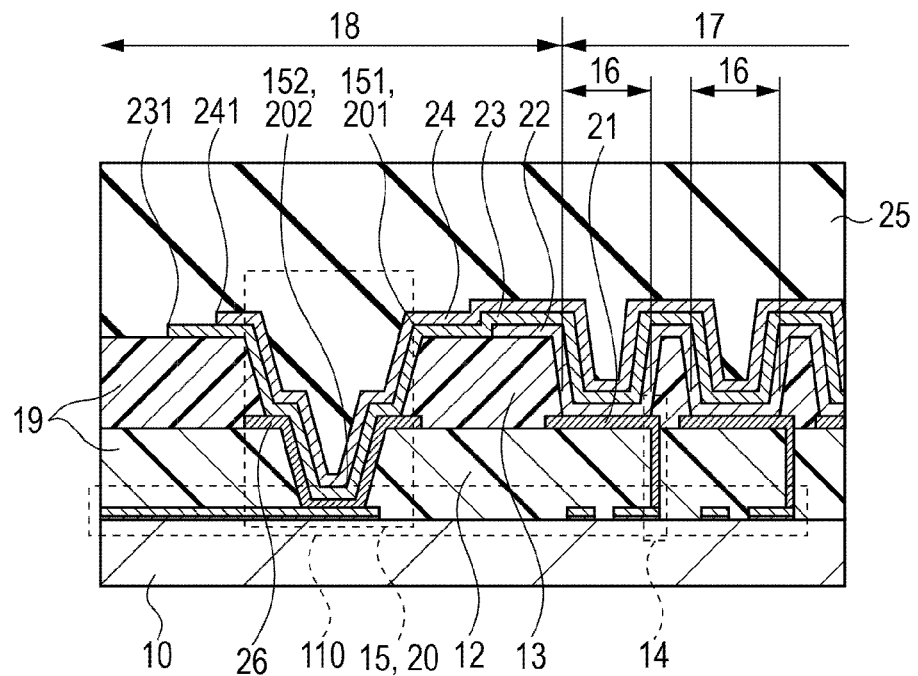
Figure 1C:
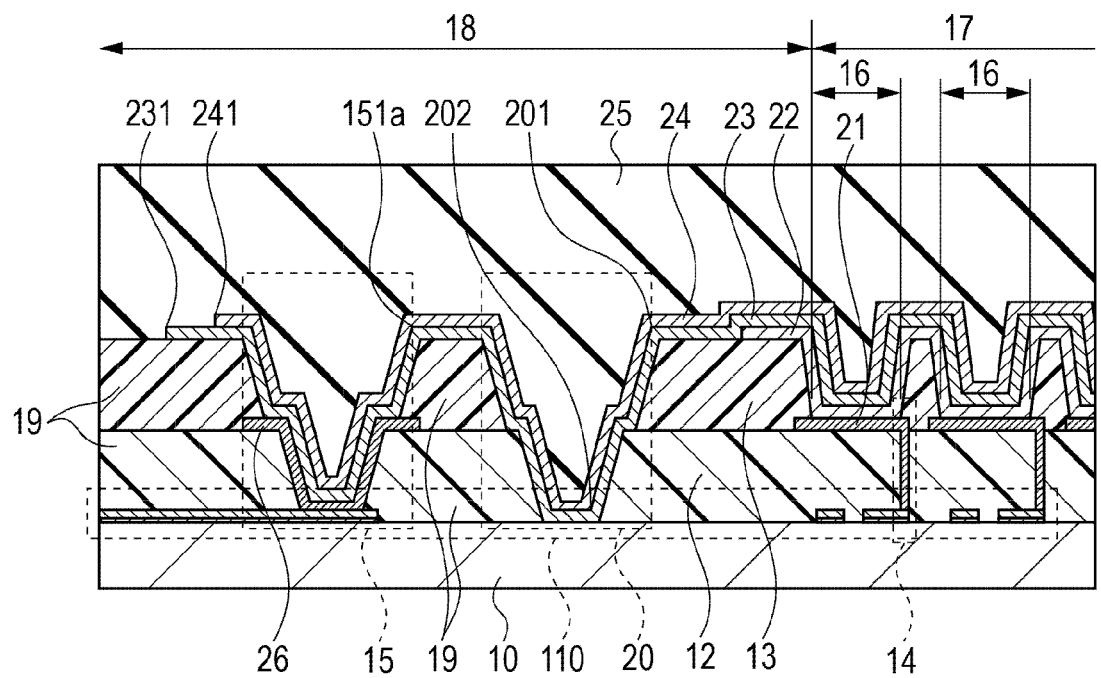

FIGS. 1A to 1C are schematic diagrams of a light-emitting apparatus according to an embodiment of the present invention. FIG. 1A is a schematic perspective view of an end portion of the light-emitting apparatus according to an embodiment of the present invention. The light-emitting apparatus according to an embodiment of the present invention has a light-emitting region 17, in which a plurality of pixels 16 are arranged, and an external region 18 disposed outside the light-emitting region 17. FIG. 1B is a schematic sectional view along with a line IB-IB shown in FIG. 1A. The light-emitting apparatus according to an embodiment of the present invention includes a substrate 10 having a light-emitting region 17 and an external region 18 and a drive circuit 110 disposed on the substrate 10. A planarizing layer 12 to flatten the upper portion of the drive circuit 110 is disposed on the drive circuit 110 in the light-emitting region 17 and a first electrode 21 is disposed on the planarizing layer 12. A partition member 13 to partition the first electrode 21 on a pixel 16 basis is disposed on the planarizing layer 12. An organic compound layer 22 including at least a light-emitting layer is disposed on the first electrode 21, and a second electrode 23 is disposed on the organic compound layer 22 and the partition member 13 and all over the light-emitting region 17. The first electrode 21, the organic compound layer 22, and the second electrode 23 constitute the organic electroluminescent element. A cap layer 24 is disposed on the second electrode 23 (organic electroluminescent element). The cap layer 24 is formed in such a way that a formation end 241 of the cap layer 24 is located in the outer side of the light-emitting region 17. Furthermore, the second electrode 23 is disposed over from the light-emitting region 17 to a contact portion 15 (space region 20) in such a way as to be connected to the drive circuit 110 disposed in the external region 18 through the contact portion 15 (for details, through a metal layer 26 in the contact portion 15). FIG. 1B shows the configuration in which the opening of the planarizing layer 12 is located at a position overlapping the opening of the partition member 13 in an in-plane direction of the substrate. However, the openings may be located at different positions. In this case, as shown in FIG. 1B, the metal layer 26 is disposed in such a way that an opening of the planarizing layer 12 is covered and, in addition, at least a part of the metal layer 26 is located at a position overlapping an opening of the partition member 13 in an in-plane direction of the substrate. Consequently, the second electrode 23 is electrically connected to the drive circuit 110 through the metal layer 26.

The light-emitting region 17 is a region in which a plurality of partitioned pixels are arranged and is composed of the plurality of pixels and regions sandwiched by the pixels. The term pixel refers to a region in which the organic compound is in direct contact with and sandwiched by the first electrode and the second electrode in a direction perpendicular to the substrate.

The first electrode 21 is electrically connected to a part of the drive circuit 110 disposed in the light-emitting region 17 through the contact portion 14. A resin layer 19 is disposed on the drive circuit 110 in the external region 18 in order to protect the drive circuit 110. The resin layer 19 is spaced from the planarizing layer 12 and the partition member 13 with the contact portion 15 (space region 20) therebetween in an in-plane direction of the substrate 10.

In the present invention, as for the cap layer 24, known organic compound materials can be used. In particular, the same materials as those used for the organic compound layer 22 can be used, and the cap layer 24 can be formed by a vacuum heating evaporation method. Furthermore, as for the cap layer 24, lithium fluoride or the like can be used and formation can be performed by a vacuum evaporation method. The cap layer 24 can be provided with a function of a light interference layer by adjusting the film thickness or the refractive index of the material and, thereby, the light-taking-out efficiency of the organic electroluminescent element can be improved. Moreover, a function of a damage mitigation layer may be provided in the case where a protective layer 25 is formed, as shown in FIG. 1B, by using a high-energy film formation method, e.g., a sputtering method or a plasma CVD method. Both functions of a light interference layer and the damage mitigation layer may be provided. In the case where the cap layer 24 is used as the light interference layer, a low-refractive index material can be used. As for the low-refractive index material, lithium fluoride can be used. The film thickness of the cap layer 24 is preferably 5 nm or more, and 300 nm or less. The cap layer 24 may be a layer in which layers formed from a plurality of mutually different materials are laminated. In general, organic compound materials suitable for the damage mitigation layer and the light interference layer and lithium fluoride are materials which absorb moisture easily.

Consequently, in the light-emitting apparatus according to an embodiment of the present invention, the cap layer 24 is formed in such a way that the formation end 241 of the cap layer 24 is located in the side nearer to the light-emitting region than is the formation end 231 of the second electrode 23 so as not to come into contact with the resin layer 19. According to this configuration, it is suppressed that moisture and gases inherent in the resin layer 19 are transferred from the external region 18 to the light-emitting region 17 through the cap layer 24 and enter into the organic electroluminescent element through defective parts due to foreign substances or the like of the second electrode 23 of the organic electroluminescent element, and degradation of the organic electroluminescent element is suppressed.

Figure 2A:
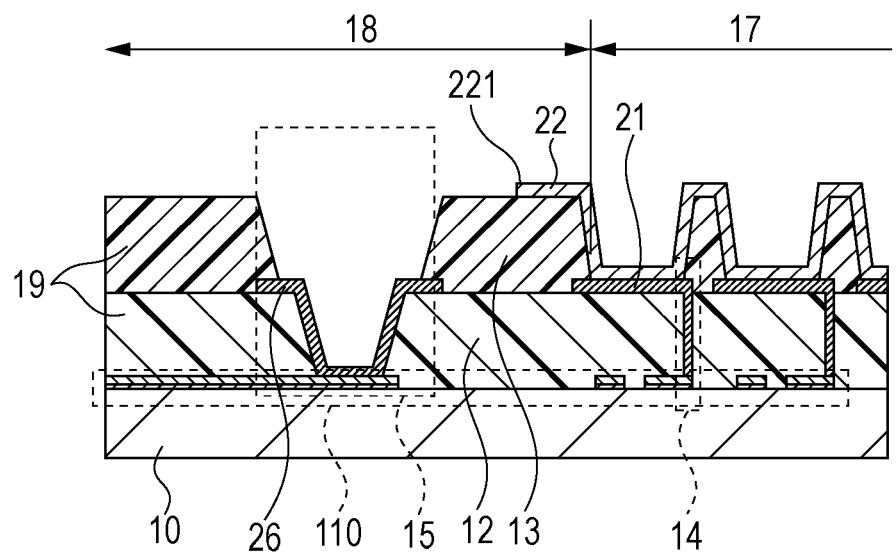
FIGS. 2A to 2D are schematic diagrams for explaining a method for manufacturing a light-emitting apparatus according to an embodiment of the present invention.

A method for manufacturing the light-emitting apparatus according to an embodiment of the present invention will be described below with reference to FIGS. 2A to 2D. The sectional views shown in FIGS. 2A to 2D are sectional views indicating the same region as that of the sectional view shown in FIG. 1B. Initially, as shown in FIG. 2A, the drive circuit 110 is formed on the substrate 10. The drive circuit 110 is formed from a metal wiring, e.g., Al, TFT by using polysilicon or amorphous silicon, and the like. The TFT and the like can be formed by using a known process.

Subsequently, the planarizing layer 12 is formed on the drive circuit 110. As for the material for the planarizing layer 12, an inorganic film of SiN, SiO, or the like, or a resin film of an acrylic resin, an epoxy resin, a polyimide resin, or the like can be used. The planarizing layer 12 can be formed by a sputtering method, a CVD method, a spin coating method, or the like. In particular, in the case where a top emission and active matrix type organic electroluminescent element is used, a resin film can be used as the planarizing layer, and it is desirable that the film thickness thereof is 1 μm or more. Furthermore, a part of or all of the resin layer 19 may be formed through the same steps and from the same material as those of the planarizing layer in such a way as to cover the drive circuit 110 disposed in the external region 18. According to this configuration, a damage to the drive circuit 110 during formation of the light-emitting apparatus can be reduced.

The contact portion 14 and the contact portion 15 (space region 20) are formed in the planarizing layer 12. The contact portions are formed by using, for example, photolithography.

The first electrode 21 is formed on the planarizing layer 12. A metal film is formed from a metal, e.g., Cr, Al, Ag, Au, or Pt, or an alloy thereof by the sputtering method or the like and patterning is performed by photolithography or the like, so that the first electrode 21 is formed. It is desirable that the film thickness of the metal film is 50 nm or more in such a way that the reflectivity at the surface thereof becomes 40% or more in a visible light region (wavelength 400 nm to 780 nm). The first electrode 21 may have a configuration in which transparent oxide electrically conductive films of indium tin oxide, indium zinc oxide, or the like are laminated on the above-described metal film. In this regard, the term transparent refers to that the light transmittance in the visible light region is 40% or more. The first electrode 21 is electrically connected to a part of the drive circuit 110 through the contact portion 14 disposed in the light-emitting region 17. At this time, the metal layer 26 is formed in the contact portion 15 disposed in the external region 18 through the same steps and from the same material as those of the first electrode 21. This metal layer 26 reduces a damage applied to the drive circuit 110 during patterning of the first electrode 21.

Then, the partition member 13 is formed in such a way that the contact portion 14 is covered and an opening is disposed in the first electrode 21. As for the partition member 13, the same material and manufacturing method as those of the above-described planarizing layer 12 can be used, and a resin film can be used. In the case where the partition member 13 covers the edge portions of the first electrode 21, an occurrence of short-circuit between the first electrode 21 and the second electrode formed all over the light-emitting region 17 can be prevented. Furthermore, a part of or all of the resin layer 19 may be formed through the same steps and from the same material as those of the partition member 13 in such a way as to cover the drive circuit 110 disposed in the external region 18. According to this configuration, damage to the drive circuit 110 during formation of the light-emitting apparatus can be reduced. The contact portion 15 (space region 20) to separate the resin layer 19 disposed in the external region 18 from the partition member 13 disposed in the light-emitting region 17 is formed in the partition member 13. The opening of the partition member 13 on the first electrode 21 and the contact portion 15 are formed by using, for example, a photolithography method.

The organic compound layer 22 including at least the light-emitting layer is formed on the first electrode 21. The organic compound layer 22 can be formed through the use of a known material by a mask evaporation method, an ink-jet method, or the like. The organic compound layer 22 may include a hole injection layer, a hole transport layer, an electron transport layer, an electron injection layer, and other organic functional layers, as necessary, besides the light-emitting layer. By the way, in FIG. 1B and FIGS. 2A to 2D, the organic compound layer 22 is connected to adjacent pixels. However, in the case where emission colors of adjacent pixels are mutually different, it is necessary that at least the light-emitting layers are formed independently. For example, in the case where film formation of the light-emitting layer is performed by the mask evaporation method, the film formation regions of the light-emitting layers can be specified by using a shadow mask having openings at regions corresponding to the pixels.

Here, the formation end 221 of the organic compound layer 22 is located in the side nearer to the light-emitting region 22 than is the contact portion 15 in such a way that the organic compound layer 22 does not reach the contact portion 15 disposed in the external region 18. According to this configuration, the second electrode 23 formed thereafter is connected to the metal layer 26 in the contact portion 15, and the second electrode 23 is electrically connected to the drive circuit 110 through the contact portion 15.

Figure 2B:
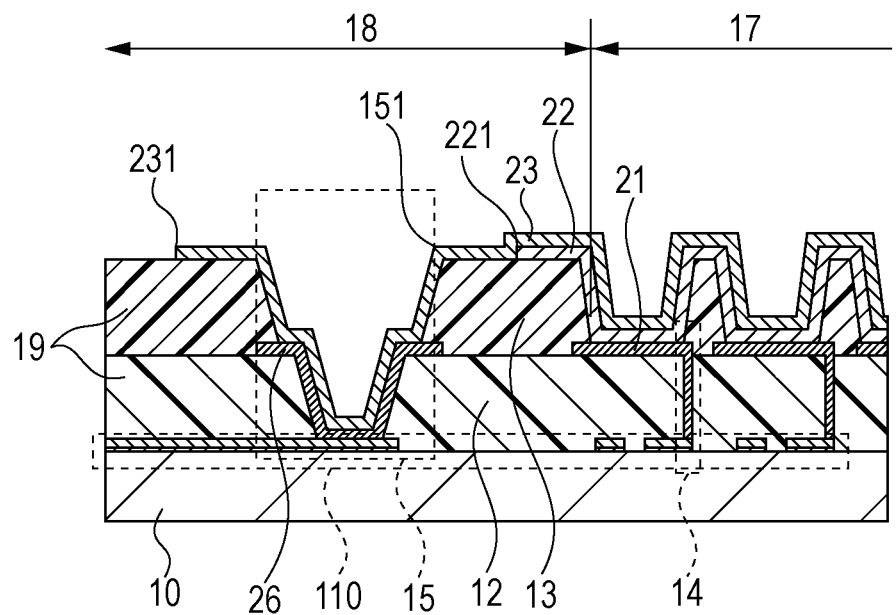

Next, as shown in FIG. 2B, the second electrode 23 is formed on the organic compound layer 22 and the partition member 13. As for the second electrode 23, a transparent oxide electrically conductive film of indium tin oxide, indium zinc oxide, or the like or a metal film, which is formed from a metal material composed of a metal, e.g., Al or Ag, or an alloy and which has a film thickness of 5 nm or more, and 20 nm or less, can be used. The second electrode 23 is formed by a sputtering method, a vacuum evaporation method, or the like. The second electrode 23 is formed in such a way as to be electrically connected to the drive circuit 110 through the contact portion 15 in the external region 18 outside the light-emitting region 17. Consequently, the film formation region of the second electrode 23 is from a whole light-emitting region 17 to a region covering the contact portion 15. In FIG. 2B, the formation end 231 of the second electrode 23 is formed up to on the resin layer 19. However, it is not necessary that the second electrode 23 is formed up to on the resin layer 19. It is enough that the second electrode 23 is connected to the drive circuit 110 at least by coming into direct contact with the metal layer 26 in the contact portion 15.

Figure 2C:
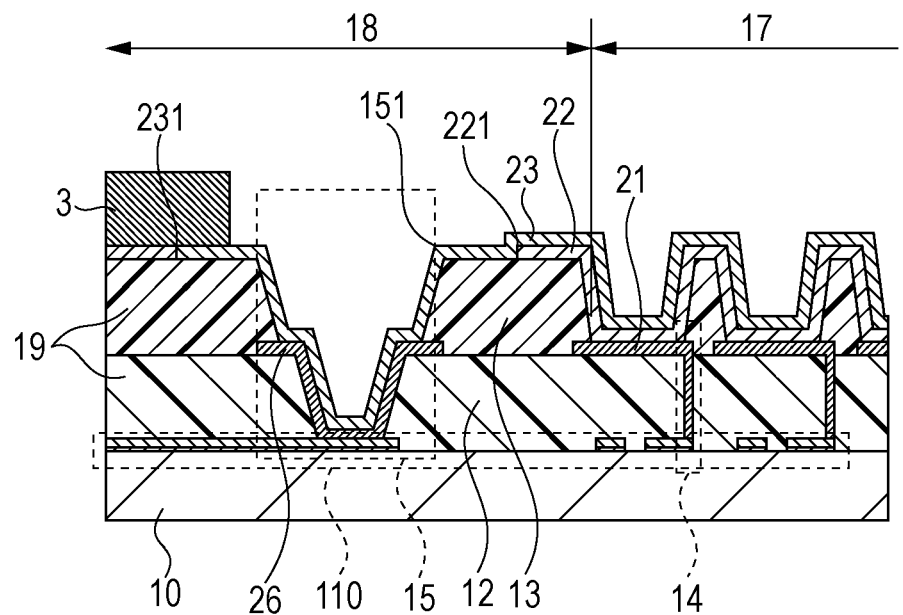
Figure 2D:
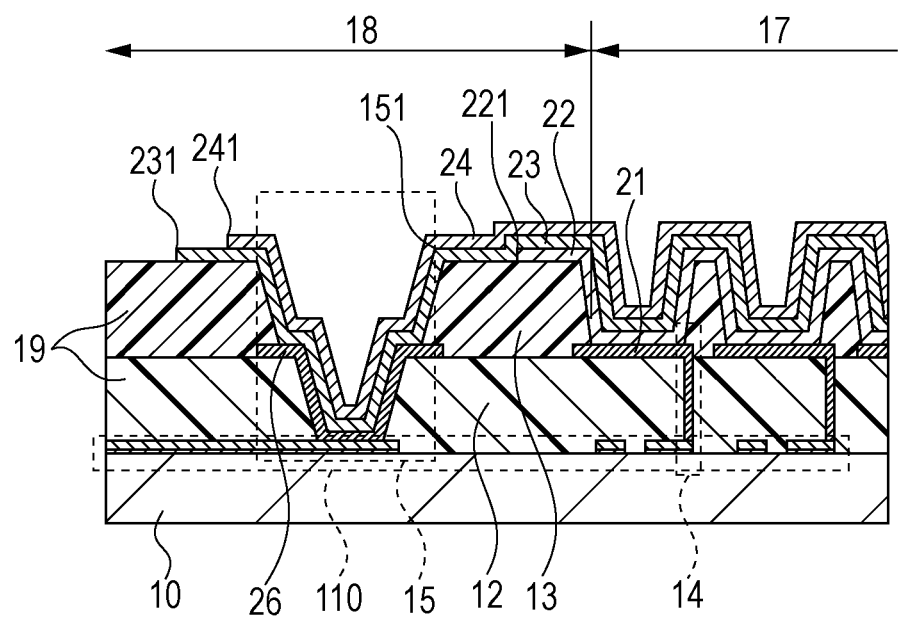

Subsequently, as shown in FIG. 2D, the cap layer 24 is formed on the second electrode 23 by a mask evaporation method through the use of a shadow mask while being located in the side nearer to the light-emitting region 17 than is the formation end 231 of the second electrode 23. At that time, as shown in FIG. 2C, a mask 3 is disposed in the side opposite to the light-emitting region 17 side in the in-plane direction of the substrate 10 while being spaced from the second electrode 23 disposed in the side nearer to the light-emitting region 17 than is the upper end 151 (201) of the side surface of the partition member 13 disposed in the light-emitting region side of the contact portion 15 (space region 20). The cap layer 24 is formed in that state. Therefore, regarding the second electrode 23, the portion from the drive circuit 110 through the contact portion 15 to the light-emitting region 17 of the second electrode 23 does not come into contact with the mask 3. Consequently, a damage to the second electrode 23 can be reduced and the drive circuit 110 can be favorably electrically connected to the second electrode 23 disposed in the light-emitting region 17. This can be verified because of the configuration in which the formation end 241 of the cap layer 24 and the formation end 231 of the second electrode 23 are located in the outside of the upper end 151 (201) of the side surface of the partition member 13 disposed in the light-emitting region side of the contact portion 15 (space region 20).

The position of disposition of the mask may be a position spaced, in the direction perpendicular to the substrate 10, from the second electrode 23 disposed in the side nearer to the light-emitting region 17 than is the upper end portion 151 of the side surface of the partition member 13 disposed in the light-emitting region 17 side of the contact portion 15. Alternatively, the position of disposition of the mask may be a position in the side opposite to the light-emitting region 17 side in the in-plane direction of the substrate 10, the position being spaced from the upper end 151 of the side surface of the partition member 13 disposed in the light-emitting region 17 side of the contact portion 15. Furthermore, the position of disposition of the mask may be the position satisfying both of them. In FIG. 2C, the mask 3 is disposed in the side opposite to the light-emitting region 17 side in the in-plane direction of the substrate 10 while being spaced from the second electrode 23 disposed in the side nearer to the light-emitting region 17 than is the upper end 151 of the side surface of the partition member 13 disposed in the light-emitting region 17 side of the contact portion 15. In addition, the mask 3 is disposed at the position overlapping the second electrode 23 in the in-plane direction of the substrate 10 and being in the close proximity to the second electrode 23 in a direction perpendicular to the substrate 10. According to this configuration, the formation end 241 of the cap layer 24 can be controlled. In FIG. 2C, in the case where the mask 3 is disposed while being spaced from the second electrode 23 on the resin layer 19 in the direction perpendicular to the substrate 10, the formation end 241 of the cap layer 24 is formed up to the position farther from the light-emitting region 17. Consequently, a frame of the light-emitting apparatus becomes large, so that miniaturization of the light-emitting apparatus is not facilitated.

Furthermore, it becomes possible to control the location of the formation end 241 of the cap layer 24 at the position in the side nearer to the light-emitting region than is the position of the formation end 231 of the second electrode 23 by disposing the mask 3 at the position overlapping the second electrode 23 on the resin layer 19 in the in-plane direction of the substrate 10 and being in the close proximity to the second electrode 23 in a direction perpendicular to the substrate 10, as shown in FIG. 2C. Consequently, the resin layer 19 does not come into contact with the cap layer 24 and, thereby, transfer of moisture and gases inherent in the resin layer 19 up to the light-emitting region 17 can be suppressed.

In the light-emitting apparatus according to an embodiment of the present invention, the protective layer 25 to protect the organic electroluminescent element from moisture and gases may be formed on the cap layer 24, as shown in FIG. 1B, or not be formed. As for the protective layer 25, an inorganic layer formed from an inorganic material, e.g., SiN, can be used. The configuration of the protective layer 25 may be a single layer configuration of the inorganic layer or be a configuration in which the inorganic layer and an organic layer formed from an organic resin or the like are laminated. This laminated configuration may be a configuration in which an organic layer is formed on an inorganic layer and an inorganic layer is further formed thereon. The inorganic layer can be formed by a technique of a sputtering method, a plasma CVD method, or the like from the viewpoint of the moisture resistance.

As shown in FIG. 1B, in the light-emitting apparatus provided with the protective layer 25, the formation end 241 of the cap layer 24 and the formation end 231 of the second electrode 23 can be located in the outside of the lower end 152 (202) of the side surface of the planarizing layer 12 disposed in the light-emitting region 17 side of the contact portion 15 (space region 20). In the case where this configuration is not employed, the protective layer 25 is formed on the second electrode 23 in a region, in which the planarizing layer 12 and the partition member 13 are disposed, while being in contact with the second electrode 23. The surface of the second electrode 23 is usually uneven because of foreign substances on the second electrode 23, foreign substances in the organic electroluminescent element, or the like. In the case where the protective layer 25 is formed thereon directly by the above-described method, defects are generated easily in the protective layer 25. Then, moisture and gases from the outside enter the organic electroluminescent element in the light-emitting region 17 through these defects and through the planarizing layer 12 and the partition member 13. In order to reduce this problem, the cap layer 24 can cover a wide region as much as possible. However, in the case where at least the above-described configuration is employed, it is possible to reduce. This is because defects are not generated easily in the protective layer 25 on at least the planarizing layer 12 and the partition member 13, and entrance of moisture and gases into the planarizing layer 12 and the partition member 13 are suppressed. In addition, the cap layer 24 can be disposed beyond the contact portion 15 up to on the resin layer 19. However, the formation end 241 of the cap layer 24 is located in the side nearer to the light-emitting region than is the formation end 231 of the second electrode 23.

The resin layer 19 disposed in the external region 18 may be disposed around the light-emitting region 17, or be disposed on one side of the light-emitting region insofar as the resin layer 19 is disposed at a position to cover the drive circuit 110 disposed in the external region 18. A configuration in which the resin layer 19 is disposed on only the drive circuit 110 disposed in the external region 18 can be employed in order to reduce the absolute value of moisture inherent in the light-emitting apparatus.

The contact portion 15 may be disposed in such a way that a part of the resin layer 19 disposed in the external region 18 and the planarizing layer 12 and the partition member 13 disposed in the light-emitting region 17 are spaced from each other or they are spaced from each other completely. In the case of the latter configuration, diffusion of moisture inherent in the resin layer 19 or moisture entering the resin layer 19 to the planarizing layer 12 and the partition member 13 can be prevented.

In the above-described configuration, the drive circuit 110 in contact with the second electrode 23 is disposed in the space region 20, although not limited to this. As shown in FIG. 1C, another configuration may be employed, in which a space region 20, besides the contact portion 15, to separate the resin layer 19 disposed in the external region 18 from the planarizing layer 12 and the partition member 13 disposed in the light-emitting region 17 is disposed in the side nearer to the light-emitting region than is the contact portion 15. In the case of this configuration, the planarizing layer 12 and the partition member 13 are separated from other layers, that is, layers formed from a resin disposed in the external region 18 (resin layer 19), by the space region 20. Consequently, diffusion of moisture inherent in the layers formed from the resin (resin layer 19) or moisture entering the layers formed from the resin (resin layer 19) to the planarizing layer 12 and the partition member 13 can be prevented. It is desirable that the space region 20 is formed in such a way that the resin layer 19 disposed in the external region 18 is separated completely from the planarizing layer 12 and the partition member 13 disposed in the light-emitting region 17. In FIG. 1C as well, the formation end 241 of the cap layer 24 is located in the side nearer to the light-emitting region than is the formation end 231 of the second electrode 23. In this configuration as well, the formation end 241 of the cap layer 24 can be located in the outside of the lower end 202 of the side surface of the planarizing layer 12 disposed in the light-emitting region 17 side of the space region 20. Furthermore, the formation end 241 of the cap layer 24 can be located in the outside of the upper end 151a of the side surface of the resin layer 19 disposed in the light-emitting region 17 side of the contact portion 15. In other words, the formation end 241 of the cap layer 24 can be located in the opposite side with the light-emitting region 17 side for the upper end 151a. In this regard, in FIG. 1C, the same constituents as those in FIG. 1B are indicated by the same reference numerals as those set forth above.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-288831 filed Dec. 21, 2009 and No. 2010-248980 filed Nov. 5, 2010, which are hereby incorporated by reference herein in their entirety.

What is claimed is:

1. A light-emitting apparatus comprising:
a substrate having a light-emitting region, in which a plurality of pixels are arranged, and an external region disposed laterally outside the light-emitting region;
a drive circuit disposed on the substrate;
a resin film comprising a planarizing layer to flatten the upper portion of the drive circuit disposed in the light-emitting region;
organic electroluminescent elements disposed on the planarizing layer, each of the organic electroluminescent elements comprising, in order from the substrate,
a first electrode,
an organic compound layer and
a second electrode contacted with the drive circuit at a contact portion in the external region; and
a light interference layer disposed on the second electrode of the organic electroluminescent elements for improving the light extracting efficiency of the organic electroluminescent element;
wherein the second electrode and the light interference layer extend from the light-emitting region to the external region,
wherein a formation end of the second electrode in the external region is disposed on the resin film,
wherein a formation end of the light interference layer in the external region is located in a side nearer to the light-emitting region than is the formation end of the second electrode, and
wherein the formation end of the light interference layer is located in the outside of an upper end of a side surface of the resin film adjacent to the contact portion with respect to the light-emitting region.

2. The light-emitting apparatus according to claim 1,
wherein the resin film comprises a partition member to partition the organic electroluminescent element, and
wherein the formation end of the light interference layer and the formation end of the second electrode are located in an outside of an upper end of a side surface of the partition member.

3. The light-emitting apparatus according to claim 1,
wherein the formation end of the light interference layer and the formation end of the second electrode are located in an outside of a lower end of a side surface of the planarizing layer.

4. The light-emitting apparatus according to claim 1,
wherein the light interference layer includes at least one of an organic compound material and lithium fluoride.

5. The light-emitting apparatus according to claim 1,
wherein the resin film comprises a resin layer disposed in the external region and spaced from the planarizing layer with a space region, and
wherein the second electrode is electrically connected to the drive circuit in the space region.

6. The light-emitting apparatus according to claim 1, further comprising a protective layer protecting the organic electroluminescent elements from moisture and gases and disposed in contact with the light interference layer.

7. The light-emitting apparatus according to claim 1, wherein a portion of the substrate having the light-emitting region is adjacent to a portion of the substrate having the external region.

8. The light-emitting apparatus according to claim 1,
wherein the light interference layer comprises an alkali metal.

9. The light-emitting apparatus according to claim 8,
wherein the alkali metal is lithium.

10. The light-emitting apparatus according to claim 1,
wherein the light interference layer comprises lithium fluoride.

11. The light-emitting apparatus according to claim 1, wherein the external region is disposed laterally outside the light-emitting region along a plane of the substrate that is the same as a plane of the substrate in which the light-emitting region is disposed.

12. The light-emitting apparatus according to claim 1, the formation end of the light interference layer is located in the outside of the contact portion with respect to the light-emitting region.

* * * * *